United States Patent
Chen et al.

(10) Patent No.: US 11,270,745 B2
(45) Date of Patent: Mar. 8, 2022

(54) METHOD OF FOREGROUND AUTO-CALIBRATING DATA RECEPTION WINDOW AND RELATED DEVICE

(71) Applicant: Realtek Semiconductor Corp., HsinChu (TW)

(72) Inventors: Shih-Chang Chen, Miaoli County (TW); Chun-Chi Yu, Hsinchu County (TW); Chih-Wei Chang, Hsinchu County (TW); Kuo-Wei Chi, Hsinchu (TW); Fu-Chin Tsai, Taipei (TW); Shih-Han Lin, Hsinchu County (TW); Gerchih Chou, San Jose, CA (US)

(73) Assignee: Realtek Semiconductor Corp., HsinChu (TW)

( * ) Notice: Subject to any disclaimer, the term of this patent is extended or adjusted under 35 U.S.C. 154(b) by 414 days.

(21) Appl. No.: 16/521,577

(22) Filed: Jul. 24, 2019

(65) Prior Publication Data

US 2021/0027817 A1    Jan. 28, 2021

(51) Int. Cl.
*G11C 7/22* (2006.01)
*G06F 13/16* (2006.01)
*G06F 1/12* (2006.01)
*G06F 1/14* (2006.01)

(52) U.S. Cl.
CPC .............. *G11C 7/222* (2013.01); *G06F 1/12* (2013.01); *G06F 1/14* (2013.01); *G06F 13/1689* (2013.01)

(58) Field of Classification Search
CPC ..... G11C 7/222; G11C 29/023; G11C 29/028; G11C 29/12015; G11C 29/50012; G11C 11/4076; G11C 2207/2254; G11C 11/409; G06F 1/12; G06F 1/14; G06F 13/1689
See application file for complete search history.

(56) References Cited

U.S. PATENT DOCUMENTS

| | | | |
|---|---|---|---|
| 9,401,189 B1 * | 7/2016 | Ding | G11C 29/023 |
| 9,911,478 B1 * | 3/2018 | Peddu | G06F 13/1689 |
| 2009/0031091 A1 * | 1/2009 | Chang | G06F 13/1689 711/154 |
| 2018/0189213 A1 * | 7/2018 | Bandi | G06F 15/76 |
| 2020/0402582 A1 * | 12/2020 | Yang | G11C 11/5671 |

* cited by examiner

*Primary Examiner* — Ajay Ojha
(74) *Attorney, Agent, or Firm* — Winston Hsu (57) ABSTRACT

A method of foreground auto-calibrating data reception window for a DRAM system is disclosed. The method comprises receiving data strobe and data from a DRAM of the DARM system, capturing a data strobe clock according to the received data strobe, generating three time points with a period of the data strobe clock, sampling the data at the three time points, to obtain three sampled data, determining whether to adjust positions of the three time points according to a comparison among the three sampled data, and configuring the valid data reception window according to the positions of the three time points when determining not to adjust the positions of the three time points.

12 Claims, 6 Drawing Sheets

METHOD OF FOREGROUND AUTO-CALIBRATING DATA RECEPTION WINDOW AND RELATED DEVICE

BACKGROUND OF THE INVENTION

1. Field of the Invention

The present invention relates to a data reception window, and more particularly, to a method of foreground auto-calibrating data reception window.

2. Description of the Prior Art

During memory access operations (e.g. memory read and memory write operations), control signals such as clock CLK, address ADDR, and command CMD signals may be conveyed from memory controller (e.g. a CPU) to memory, such as dynamic random access memory (DRAM). Clock signal CLK may serve as a system reference clock (e.g. a reference clock to the data strobe (DQS) signals, address signal ADDR, and command signal CMD should be aligned). Command signal CMD may be configured to a first value to initiate a read operation, to a second value to initiate a write operation. Address signal ADDR specifies the address (e.g., a selected bank address in the DRAM) from which data is read out during read operations and the address to which data is written during write operations.

In general, memory access operations are not synchronized with system-level control signals CLK/CMD/ADDR. As a result, the data input/output (DQ) signals that are received from the DRAM are not phase aligned with any known clock signal in the memory controller. It is therefore necessary to provide DQS signals along with the DQ signals to the memory controller from the DRAM, so that the DQS clock can be used to establish proper timing relationships for receiving the DQ signals from the DRAM.

For establishing proper timing relationships between the DQS signals and DQ signals, the DQS is given a delayed value to sample the DQ, so as to obtain valid data reception window. Conventionally, the center of the falling/rising edge of the DQS clock is used for sampling the DQ. If the DQ is not successfully sampled at the center time point, the DQS is given another delayed value for sampling the DQ until the DQ is successful received. With different delayed DQSs, which successfully sample the DQs, the valid data reception window or known as the DQ eye is thereof estimated. However, this process may consume a lot of time for the memory controller (e.g. a CPU) to process, which may affect operating system setup/or Booting speed.

SUMMARY OF THE INVENTION

It is therefore an objective to provide a method of auto-calibrating data reception window in order to solve the abovementioned problems.

The present disclosure discloses a method of foreground auto-calibrating data reception window for a DRAM system. The method comprises receiving data strobe and data from a DRAM of the DARM system, capturing a data strobe clock according to the received data strobe, generating three time points with a period of the data strobe clock, sampling the data at the three time points, to obtain three sampled data, determining whether to adjust positions of the three time points according to a comparison among the three sampled data, and configuring the valid data reception window according to the positions of the three time points when determining not to adjust the positions of the three time points.

The present disclosure discloses an auto-calibration device for data reception window configuration. The auto-calibration device comprises a data strobe clock acquisition unit, for receiving data strobe from a dynamic random access memory (DRAM) and capturing a data strobe clock, a time point splitting unit, for generating three time points with a period of the data strobe clock, a data sampling unit, for sampling data from the DRAM at the three time points, to obtain three sampled data, and a time point adjusting unit, for determining whether to adjust positions of the three time points according to a comparison among the three sampled data, and configuring a valid data reception window according to the positions of the three time points when determining not to adjust the positions of the three time points.

The present disclosure discloses a dynamic random access memory, DRAM system. The DRAM system comprises a DRAM, a memory controller, connecting to the DRAM, for performing a read operation with the DRAM, and an auto-calibration device, connecting to the memory controller and the DARM, for configuring data reception window to the memory controller, wherein the calibration device comprises a processing unit, for executing a program code, and a storage unit, coupled to the processing unit, for storing the program code, wherein the program code instructs the processing unit to perform the following steps: receiving data strobe and data from a DRAM of the DARM system, capturing a data strobe clock according to the received data strobe, generating three time points with a period of the data strobe clock, sampling the data at the three time points, to obtain three sampled data, determining whether to adjust positions of the three time points according to a comparison among the three sampled data, and configuring the valid data reception window according to the positions of the three time points when determining not to adjust the positions of the three time points.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
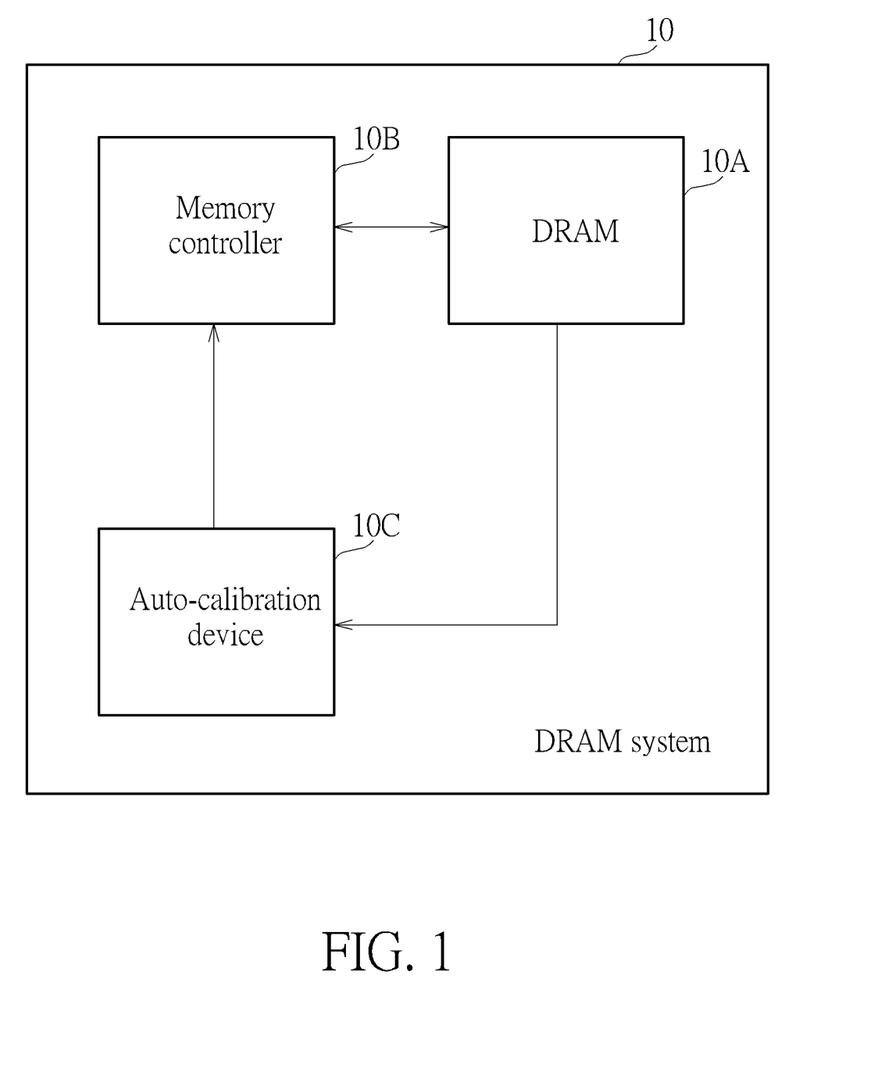
FIG. 1 is a schematic diagram of a DRAM system according to the present disclosure.

Reference is made to FIG. 1, which is a schematic diagram of the DRAM system 10. The DRAM system 10 can be applied in a personal computer, a notebook, etc. The DRAM system 10 includes the DRAM 10A, the memory controller 10B and the foreground auto-calibration device 10C. The memory controller 10B may receive data (DQ) and data strobe (DQS) from the DRAM 10A during the READ operation. In order to speed up the time to get a valid data reception window, a hardware (i.e. the foreground auto-calibration device 10C) for automatically calibrating data reception window, known as the DQ eye, is proposed in the present invention. Note that, the foreground auto-calibration device 10C is capable of configuring the valid data reception window (hereafter called DQ eye) to the memory controller 10B, such as a CPU, so that the memory controller 10B receives the DQ based on the DQ eye. With such manner in the foreground, the memory controller 10B has efficient resource for system booting or operating system setup.

Figure 2:
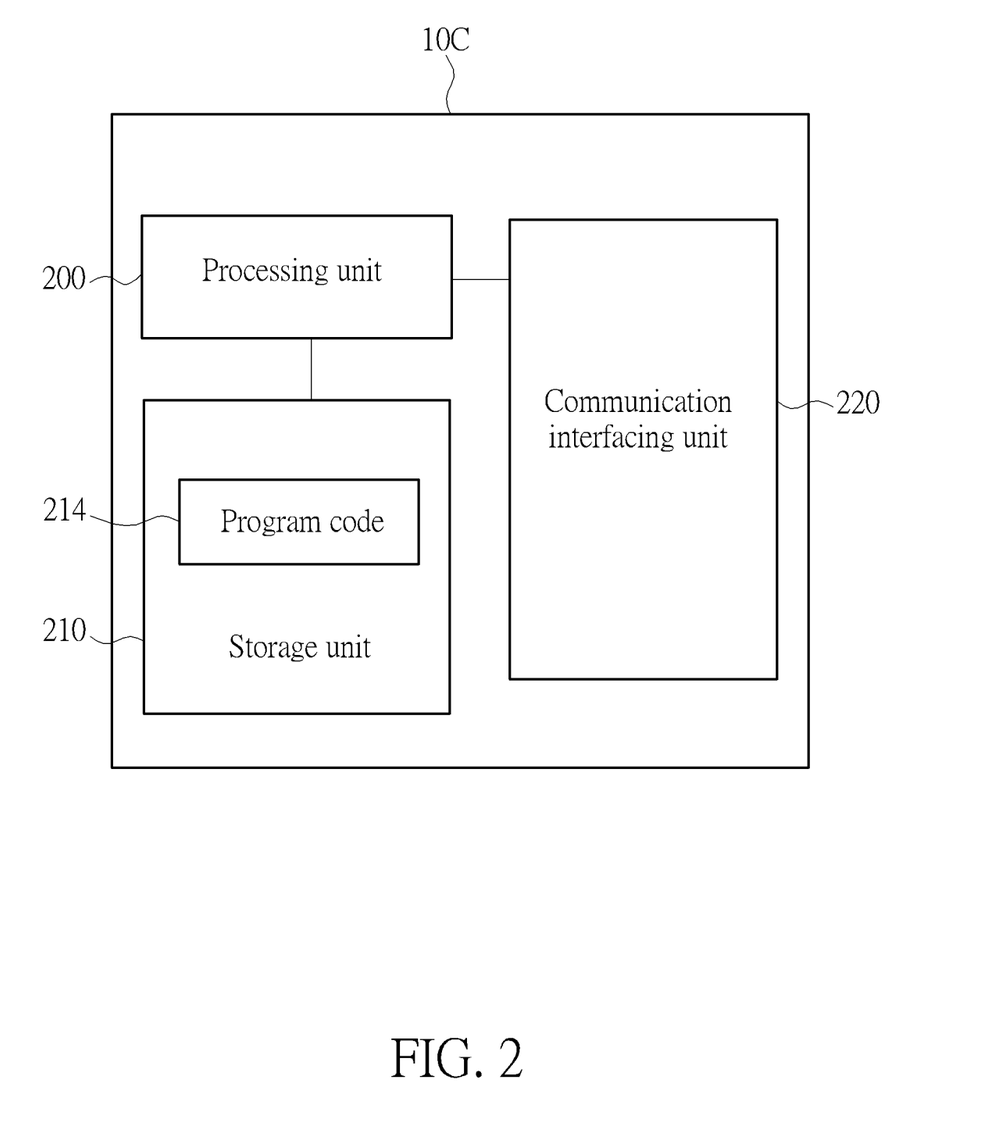
FIG. 2 is a schematic diagram of a foreground auto-calibration device according to the present disclosure.

FIG. 2 is a schematic diagram of the foreground auto-calibration device 10C. The foreground auto-calibration device 10C may include a processing unit 200 such as a microprocessor or Application Specific Integrated Circuit (ASIC), a storage unit 210 and a communication interfacing unit 220. The storage unit 210 may be any data storage device that can store program code, images and color information of the images, for access by the processing unit 200. Examples of the storage unit 210 include but are not limited to a subscriber identity module (SIM), read-only memory (ROM), flash memory, random-access memory (RAM), CD-ROMs, magnetic tape, hard disk, and optical data storage device. The communication interfacing unit 220 is preferably a transceiver with wired to exchange signals with the DRAM 10A and the memory controller 10B according to processing results of the processing unit 200.

Figure 3:
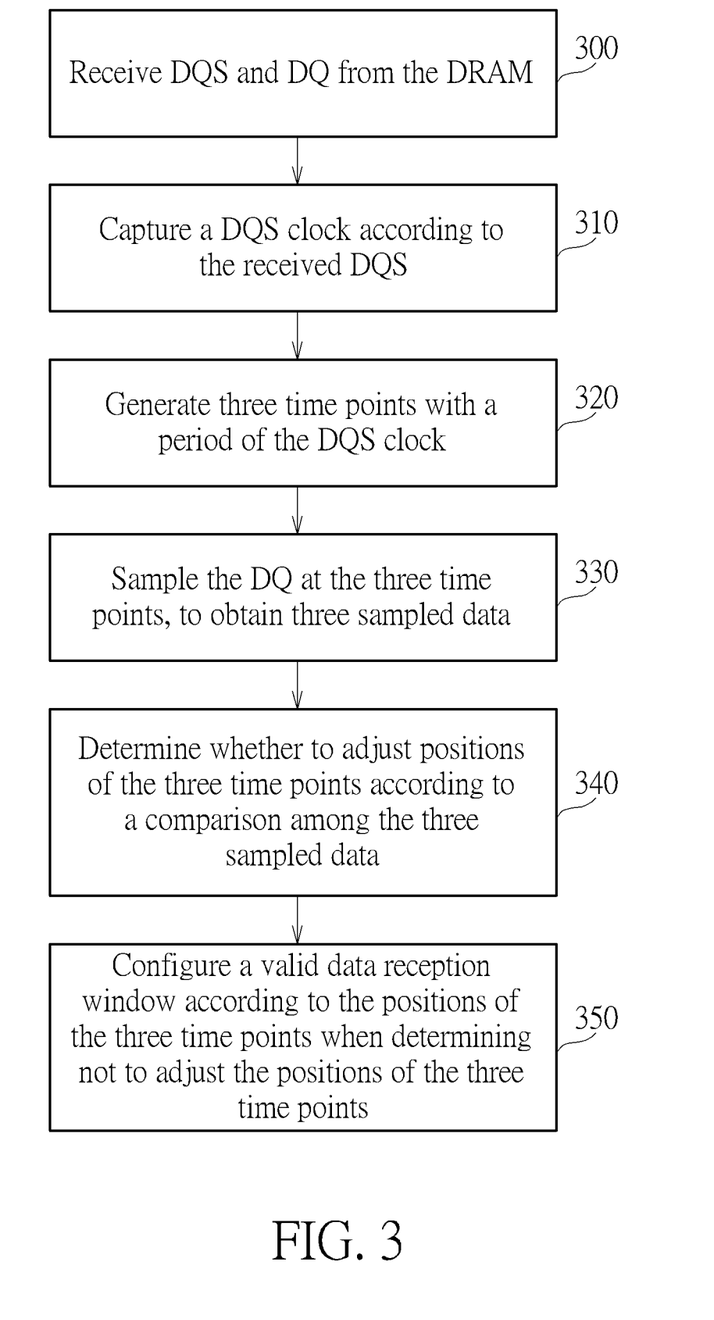
FIG. 3 is a flowchart of a foreground auto-calibration process according to the present disclosure.

Please refer to FIG. 3, which is a flowchart of the foreground auto-calibration process 30 according to an embodiment of the present disclosure. The foreground auto-calibration process 30 can be compiled into a program code and stored in the storage unit 210, and includes the following steps:

Step 300: Receive DQS and DQ from the DRAM.
Step 310: Capture a DQS clock according to the received DQS.
Step 320: Generate three time points with a period of the DQS clock.
Step 330: Sample the DQ at the three time points, to obtain three sampled data.
Step 340: Determine whether to adjust positions of the three time points according to a comparison among the three sampled data.
Step 350: Configure a valid data reception window according to the positions of the three time points when determining not to adjust the positions of the three time points.

According to the foreground auto-calibration process 30, DQ eye boundary is automatically calibrated by using three time points to sample DQs. In other words, the DQ eye boundary is automatically adjusted according to the sampled three DQ results. Thus, there is no need of different delay values for the DQS to sample the DQ to find the valid DQ eye, and thus the present invention can reduce the require time for valid DQ eye estimation and the latency of system booting or operating system setup could be decreased.

Figure 4:
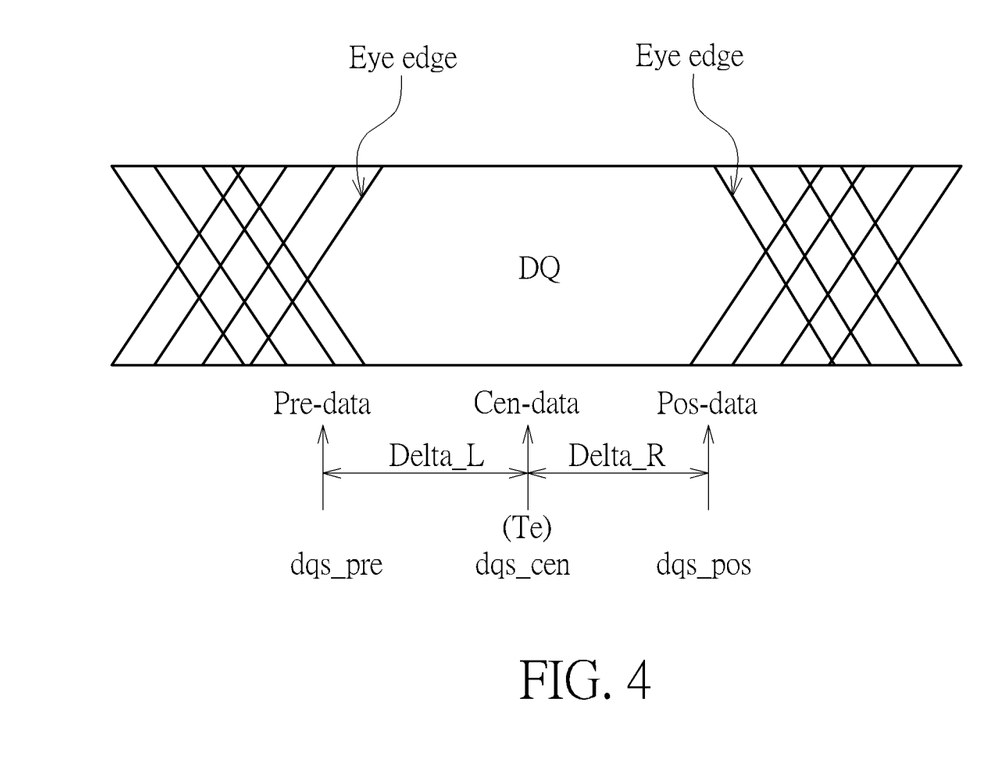
FIG. 4 is a schematic diagram of an operation of a foreground auto-calibration device according to the present disclosure.

For detailed operation of the foreground auto-calibration device 10C, reference is made to FIG. 4. The foreground auto-calibration device 10C receives DQS from the DRAM and captures the DQS clock. In an embodiment, the cycle of the DQS clock is ½ cycle of the clock signal CLK. The foreground auto-calibration device 10C splits the DQS clock into previous time point dqs_pre, center time point dqs_cen and postponed time point dqs_pos, and then samples DQs at the previous time point, center time point and postponed time point. That is, three DQ samples, namely previous data Pre-data, center data Cen-data and postponed data Pos-data, are obtained. In addition, the foreground auto-calibration device 10C determines whether the three DQ samples are the same, for adjusting the DQ eye boundary. As shown in FIG. 4, the center time point dqs_cen is set to the value Te, the distance between the previous time point dqs_pre and the center time point dqs_cen is set to value Delta_L, and the distance between the center time point dqs_cen and the postponed time point dqs_pos is set to value Delta_R. That is, the range of the valid DQ eye is equivalent to the sum of the value Delta_L and the value Delta_R.

If the previous data Pre-data, the center data Cen-data and the postponed data Pos-data are the same, the auto-calibration device 10C does not adjust the value Te of the center time point dqs_cen, the value Delta_L and the value Delta_R, and determines the valid DQ eye is framed by the previous time point dqs_pre and the postponed time point dqs_pos.

On the other hand, if the previous data Pre-data and postponed data Pos-data are not the same with the center data Cen-data, the previous data Pre-data and the postponed data Pos-data are out of DQ eye boundary. Thus, the foreground auto-calibration device 10C shifts both the previous time point dqs_pre and the postponed time point dqs_pos to be close to the center time point dqs_cen. That is, the value Delta_L and the value Delta_R are decreased by one step. In addition, the foreground auto-calibration device 10C may record the previous time point dqs_pre and the postponed time point dqs_pos out of the DQ eye boundary, so that if the sampled previous data Pre-data and the postponed data Pos-data are within the DQ eye, the auto-calibration device 10C could set the initial value Delata_L and the initial value Delta_R with a bigger value.

If only the previous data Pre-data is not the same with the center data Cen-data and the postponed data Pos-data, and the Delta_L<=Delta_R, the foreground auto-calibration device 10C shifts the center time point dqs_cen to be close to the postponed time point dqs_pos, namely increasing the value Te of center time point dqs_cen by one step. On the other hand, if only the previous data Pre-data is not the same with the center data Cen-data and the postponed data Pos-data and the Delta_L>Delta_R, the foreground auto-calibration device 10C should shift the previous time point dqs_pre to be close to the center time point dqs_cen, namely decreasing the value Delta_L by one step.

If only the postponed data Pos-data is not the same with the center data Cen-data and the previous data Pre-data and the Delta_L>Delta_R, the foreground auto-calibration device 10C should shift the center time point dqs_cen to be close to the previous time point dqs_pre, namely decreasing the value Te of the center time point dqs_cen by one step. On the other hand, if the postponed data Pos-data is not the same with the center data Cen-data and the previous data Pre-data and the Delta_L<=Delta_R, the foreground auto-calibration device 10C shifts the postponed time point dqs_pos to be close to the center time point dqs_cen, namely decreasing the value Delta_R by one step.

Note that, for any adjustment of time point position, the foreground auto-calibration device 10C should sample the DQs at the shifted previous time point dqs_pre, the shifted postponed time point dqs_pos and the shifted center time point dqs_cen, and determines whether the three DQ samples are the same, so as to adjust the DQ eye boundary as abovementioned.

Figure 5:
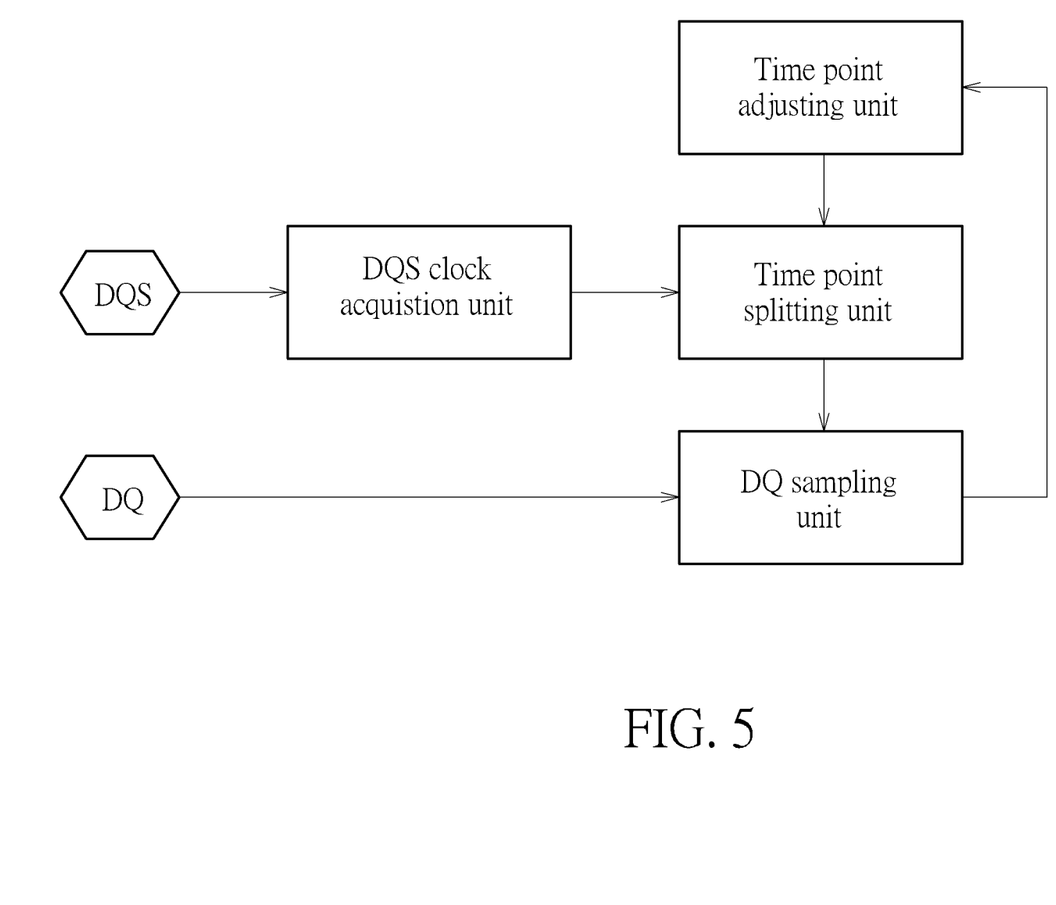
FIG. 5 is a schematic diagram of a foreground auto-calibration device according to the present disclosure.

FIG. 5 is a schematic diagram of the foreground auto-calibration device 50 according to the present disclosure. The foreground auto-calibration device 50 is used for realizing the abovementioned DQ eye boundary convergence/calibration method. In detail, the foreground auto-calibration device 50 includes DQS acquisition unit, time point splitting unit, DQ sampling unit and time point adjusting unit. The DQS acquisition unit is used for receiving DQS from the DRAM and capturing the DQS clock. The time point splitting unit is used for generating three time points (i.e. the previous time point dqs_pre, center time point dqs_cen and postponed time point dqs_pos). The DQ sampling unit is used for sampling DQ from the DRAM at the three time points, to obtain three sampled data (i.e. the previous data Pre-data, center data Cen-data and the postponed data Pos-data). The time point adjusting unit is used for determining whether to adjust positions of the three time points according to a comparison among the three sampled data.

Figure 6:
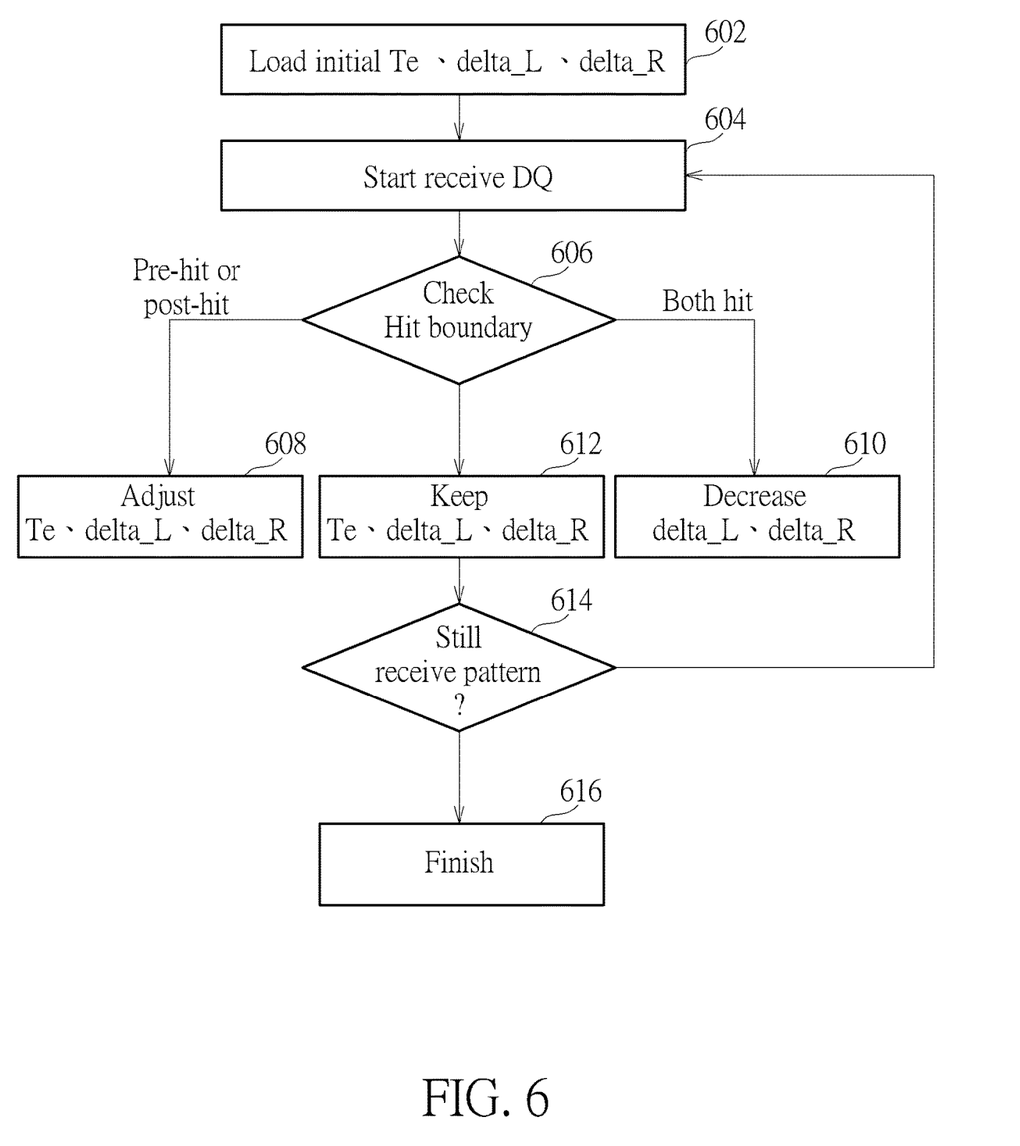
FIG. 6 is a schematic diagram of an operation of a foreground auto-calibration device according to the present disclosure.

FIG. 6 is a schematic diagram of an operation of the foreground auto-calibration device 50 according to the present disclosure.

The foreground auto-calibration device 50 loads initial values Te, Detla_L and Detla_R (step 602), and starts receiving DQ (step 604). The foreground auto-calibration device 50 check whether the DQ eye boundary is hit (step 606), which means the sampled data are the same or not. If the previous data Pre-data or the postponed data Pos-data hits the DQ eye boundary (e.g. Pre-data="1", but Cen-data and Pos-data="0", or Pre-data="0", but Cen-data and Pos-data="1"), the foreground auto-calibration device 50 adjusts the values Te, Detla_L and Detla_R (step 608). If both the previous data Pre-data and the postponed data Pos-data hit the DQ eye boundary (e.g. Pre-data and Pos-data="1", but Cen-data="0", or Pre-data and Pos-data="0", but Cen-data="0"), the foreground auto-calibration device 50 decreases the values Detla_L and Detla_R (step 610). If no hit (i.e. Pre-data, Cen-data and Pos-data are the same), the auto-calibration device 50 keeps the values Te, Detla_L and Detla_R (step 612). In addition, the foreground auto-calibration device 50 continuously preforms the valid DQ eye boundary calibration for receiving DQ until the DQ transmission finish (steps 614-616).

The abovementioned steps of the processes including suggested steps can be realized by means that could be a hardware, a firmware known as a combination of a hardware device and computer instructions and data that reside as read-only software on the hardware device or an electronic system. Examples of hardware can include analog, digital and mixed circuits known as microcircuit, microchip, or silicon chip. Examples of the electronic system can include a system on chip (SOC), system in package (SiP), a computer on module (COM) and the foreground auto-calibration device 10C and 50.

In conclusion, the present disclosure discloses a method of foreground auto-calibrating the data reception window, and thus the require time for valid DQ eye estimation is reduced. In addition, the valid DQ eye is directly configured to the memory controller by the foreground auto-calibration device, such that the latency of system booting or operating system setup could be decreased. Since the conventional DQS delay sampling method takes a lot of time to find the optimal valid DQ eye, 3-point sampling mechanism is proposed to eliminate the failed DQS delay value.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of foreground auto-calibrating data reception window for a dynamic random access memory, DRAM, system the method comprising:
    receiving data strobe and data from a DRAM of the DARM system;
    capturing a data strobe clock according to the received data strobe;
    generating three time points with a period of the data strobe clock;
    sampling the data at the three time points, to obtain three sampled data;
    determining whether to adjust positions of the three time points according to a comparison among the three sampled data; and
    configuring a valid data reception window according to the positions of the three time points when determining not to adjust the positions of the three time points.

2. The method of claim 1, wherein the step generating the three time points with the period of the data strobe clock comprise:
    splitting the period into a previous time point, a center time point and a postpone time point.

3. The method of claim 1, wherein the step of sampling the data at the three time points, to obtain the three sampled data comprises:
    obtaining a previous data corresponding to the previous time point;
    obtaining a center data corresponding to the center time point; and
    obtaining a third postpone data corresponding to the postpone time point.

4. The method of claim 3, wherein the step of determining whether to adjust the positions of the three time points according to the comparison among the three sampled data comprises:
    determining whether the previous data, the center data and the postponed data are the same;
    calculating a first distance between the previous time point and center time point and a second distance between the center time point and the postponed time point;
    determining not to adjust the positions of the three time points when determining the previous data, the center data and the postponed data are the same;
    shifting the previous time point and postponed time point by one step when the previous data and the postponed data are different from the center data, whereby the previous time point and the postponed time point are adjusted to be close to the center time point;
    shifting the center time point by increasing one step when the previous data is different from the center data and the postponed data, and the first distant is smaller or equivalent to the second distance;
    shifting the previous time point by increasing one step when the previous data is different from the center data and the postponed data, and the first distant is bigger than the second distance;
    shifting the center time point by decreasing one step when the postponed data is different from the center data and the previous data, and the first distant is bigger than the second distance; and
    shifting postponed time point by decreasing one step when the postponed data is different from the center data and the previous data, and the first distant is smaller or equivalent to the second distance.

5. The method of claim 4, wherein the step of configuring the valid data reception window according to the positions of the three time points when determining not to adjust the positions of the three time points comprise:
configuring a range of the valid data reception window with a relative distance between the previous time point and the postponed time point.

6. The method of claim 1, further comprising:
adjusting the positions of the three time points when determining to adjust the positions of the three time points;
wherein the step of sampling the data at the three time points comprises:
sampling the data at the adjusted three time points, to obtain three sampled data corresponding to the adjusted three time points;
wherein the step of determining whether to adjust the positions of the three time points according to the comparison among the three sampled data comprises:
determining whether to adjust positions of the adjusted three time points according to a first comparison among the three sampled data corresponding to the adjusted three time points.

7. A foreground auto-calibration device for data reception window configuration, the auto-calibration device comprising:
a data strobe clock acquisition unit, for receiving data strobe from a dynamic random access memory (DRAM) and capturing a data strobe clock;
a time point splitting unit, for generating three time points with a period of the data strobe clock;
a data sampling unit, for sampling data from the DRAM at the three time points, to obtain three sampled data; and
a time point adjusting unit, for determining whether to adjust positions of the three time points according to a comparison among the three sampled data, and configuring a valid data reception window according to the positions of the three time points when determining not to adjust the positions of the three time points.

8. The foreground auto-calibration device of claim 7, wherein the time point splitting unit is further used for splitting the period of the data strobe clock into a previous time point, a center time point and a postponed time point.

9. The foreground auto-calibration device of claim 8, wherein the data sampling unit is further used for obtaining a previous data corresponding to the previous time point, a center data corresponding to the center time point, and a postponed data corresponding to the postponed time point.

10. The foreground auto-calibration device of claim 9, wherein the time point adjusting unit is used for determining whether the previous data, the center data and the postponed data are the same, calculating a first distance between the previous time point and center time point and a second distance between the center time point and the postponed time point, determining not to adjust the positions of the three time points when determining the previous data, the center data and the postponed data are the same, shifting the previous time point and postponed time point by one step when the previous data and the postponed data are different from the center data, whereby the previous time point and the postponed time point are adjusted to be close to the center time point, shifting the center time point by increasing one step when the previous data is different from the center data and the postponed data, and the first distant is smaller or equivalent to the second distance, shifting the previous time point by increasing one step when the previous data is different from the center data and the postponed data, and the first distant is bigger than the second distance, shifting the center time point by decreasing one step when the postponed data is different from the center data and the previous data, and the first distant is bigger than the second distance, and shifting postponed time point by decreasing one step when the postponed data is different from the center data and the previous data, and the first distant is smaller or equivalent to the second distance.

11. The foreground auto-calibration device of claim 10, wherein the time point adjusting unit is further used for configuring a range of the valid data reception window with a relative distance between the previous time point and the postponed time point.

12. A dynamic random access memory, DRAM, system comprising:
a DRAM;
a memory controller, connecting to the DRAM, for performing a read operation with the DRAM; and
a foreground auto-calibration device, connecting to the memory controller and the DARM, for configuring data reception window to the memory controller, wherein the calibration device comprises:
a processing unit, for executing a program code; and
a storage unit, coupled to the processing unit, for storing the program code, wherein the program code instructs the processing unit to perform the following steps:
receiving data strobe and data from a DRAM of the DARM system;
capturing a data strobe clock according to the received data strobe;
generating three time points with a period of the data strobe clock;
sampling the data at the three time points, to obtain three sampled data;
determining whether to adjust positions of the three time points according to a comparison among the three sampled data; and
configuring the valid data reception window according to the positions of the three time points when determining not to adjust the positions of the three time points.

* * * * *